United States Patent [19]

Powell

[11] 4,263,663
[45] Apr. 21, 1981

[54] VMOS ROM ARRAY

[75] Inventor: Michael W. Powell, Mesa, Ariz.

[73] Assignee: Motorola, Inc., Schaumburg, Ill.

[21] Appl. No.: 21,369

[22] Filed: Mar. 19, 1979

[51] Int. Cl.$^3$ ............................................. G11C 11/40
[52] U.S. Cl. ................................ 365/182; 307/238.8; 365/174
[58] Field of Search ............... 365/174, 182, 183, 184, 365/185; 307/238, 279

[56] References Cited

U.S. PATENT DOCUMENTS

| 4,109,270 | 8/1978 | von Basse et al. | 357/55 |
| 4,126,881 | 11/1978 | von Basse et al. | 357/55 |

Primary Examiner—Terrell W. Fears
Attorney, Agent, or Firm—John A. Fisher

[57] ABSTRACT

An IGFET ROM array and method. A high density ROM array and method for its fabrication is disclosed. The memory array is formed of a plurality of VMOS transistors arranged in a matrix. A plurality of spaced apart diffused regions are formed on the surface of an epitaxial layer overlying a heavily doped substrate. V-grooves, oriented along the diffused regions, extend through the epitaxial layer dividing each diffused region into two electrically separate bit lines. Along the edge of the V-groove the substrate forms a source, the epitaxial layer forms the channel, and the bit line forms the drain of each of the plurality of transistors. An insulator layer is formed on the surface of the V-groove and is overlaid by spaced apart conductive word lines running orthogonal to the diffused bit lines. The conductive word lines form the gate electrodes for MOS transistors formed on each side of the V-groove. The ROM array is programmed by selectively ion implanting localized regions through the diffused bit line and into the epitaxial layer prior to the formation of the V-groove. The localized region act to increase the doping in the channel region to selectively form "off" devices. By forming the localized programming regions prior to the forming of the V-grooves, alignment restrictions are relaxed allowing for a higher density array.

2 Claims, 12 Drawing Figures

VMOS ROM ARRAY

BACKGROUND OF THE INVENTION

This invention relates to an Insulated Gate Field Effect Transistor Read Only Memory (IGFET ROM) array, and more specifically to a high density V-groove Metal-Oxide-Semiconductor (VMOS) ROM array.

As the need for larger and more powerful memories continues to grow, it becomes incumbent upon the semiconductor device manufacturer to produce larger and larger memories having higher performance characteristics on a single semiconductor chip. In order to accommodate this trend it is necessary to improve both the performance and the density of memory devices. Accordingly, attempts are made to shrink device sizes, reduce spacing between devices, and to optimize device layout. Eventually, however, yield considerations forbid the further reduction in device size. One alternative has been to turn from conventional devices to new device forms such as the VMOS transistor. This device can provide improved device characteristics as well as the potential for increased density. Heretofore, however, there has not been a practical means for employing the VMOS transistor in a ROM array nor a practical means for programming that array so as to take advantage of the potential density improvement. Further, to be used to advantage, the VMOS devices must be combined with conventional IGFET devices on the same chip.

Accordingly, it is an object of this invention to provide an improved VMOS ROM array.

It is a further object of this invention to provide a high density, high performance ROM array and method for its programming.

SUMMARY OF THE INVENTION

In one embodiment of this invention an insulated gate field effect transistor read only memory (IGFET ROM) array is fabricated in an N type semiconductor wafer having a P type epitaxial layer thereon. A plurality of bit lines are diffused into the epitaxial layer in a spaced apart relationship. Localized P type regions are diffused or ion implanted into the surface of the epitaxial layer, extending to a depth greater than that of the diffused bit lines. These localized regions increase the P type doping in selected areas of the epitaxial layer and provide a means for programming the array by increasing the threshold voltage of selected transistors. A V-shaped groove is then formed in the epitaxial wafer. The V-shaped groove is aligned with the diffused bit line and extends through the diffused line, dividing it into two electrically separate bit lines, and through the epitaxial layer to the underlying substrate. The N type semiconductor substrate forms a common source electrode for all of the transistors of the array while the diffused bit lines form drain electrodes. The edge of the V-groove forms the surface portion of a transistor channel region extending between the source and drains of the array devices. That surface portion will be characterized by either the doping level of the epitaxial layer alone or of the doping level of the epitaxial layer enhanced by the localized programming ion implantation or diffusion. A plurality of conductive word lines is then formed overlying the epitaxial layer, V-grooves, and diffused bit lines and insulated therefrom by a gate insulator. The word lines which form the gate electrodes of the memory transistors are orthogonal to the bit lines and form a memory bit location at each crossing of the word line and electrically separate bit line. At each bit location there will be an "off" or "on" transistor depending on the presence or absence of the programming implant or diffusion at that location.

BRIEF DESCRIPTION OF THE DRAWINGS

These and other objects and advantages of the invention will become apparent upon a reading of the following detailed description of the invention taken in connection with the drawings in which.

DETAILED DESCRIPTION OF THE INVENTION

Figure 1:
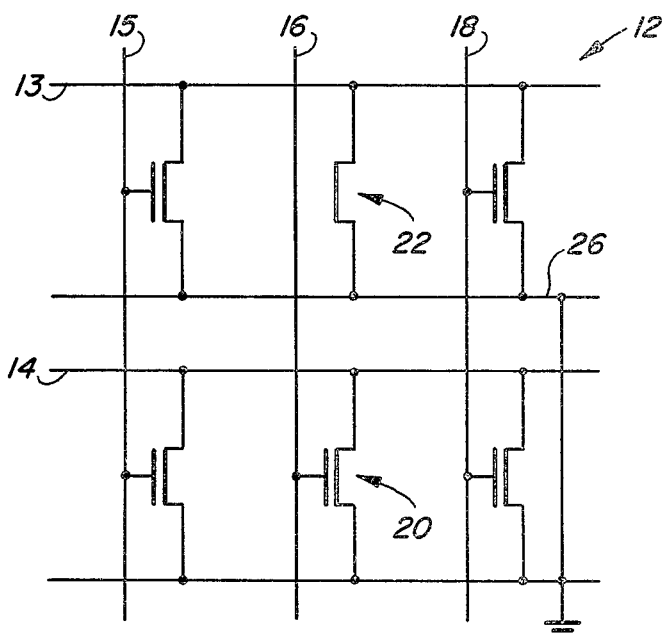
FIG. 1 shows a portion of a prior art IGFET ROM array.

FIG. 1 shows a portion of a prior art IGFET ROM array 12. A plurality of IGFET devices is arranged in a matrix with bit lines 13, 14 and orthogonal word lines 15, 16, 18. The ROM is programmed during fabrication by altering selected array devices. Device 20 is a normal IGFET device, for example, in contrast to device 22 which has been shown schematically without a gate electrode contact. Device 22 can be fabricated, for example, with a thick gate oxide which results in a high device threshold in contrast to transistor 20 which has a normal threshold voltage. A particular memory bit is selected and read by connecting a resistive load to the bit line and by addressing an appropriate word line. A read voltage is applied to the word line and the effect on the bit line is noted by the ratio of the resistance of the device to that of the load. For example, by addressing bit line 14 and word line 16, the memory bit represented by transistor 20 is selected. The read voltage applied to word line 16 is of such magnitude to exceed the normal threshold voltage and therefore is capable of turning on transistor 20. This pulls bit line 14 to ground through the turned on transistor 20 and represents the "on" logic state. If instead bit line 13 and word line 16 are addressed, the memory bit represented by device 22 is selected. The read voltage applied to word line 16 is insufficient to turn on device 22 with its high threshold voltage. Bit line 13 is thus not shorted to ground; this represents the "off" logic state. Thus, bistable logic states are formed.

Figure 2:
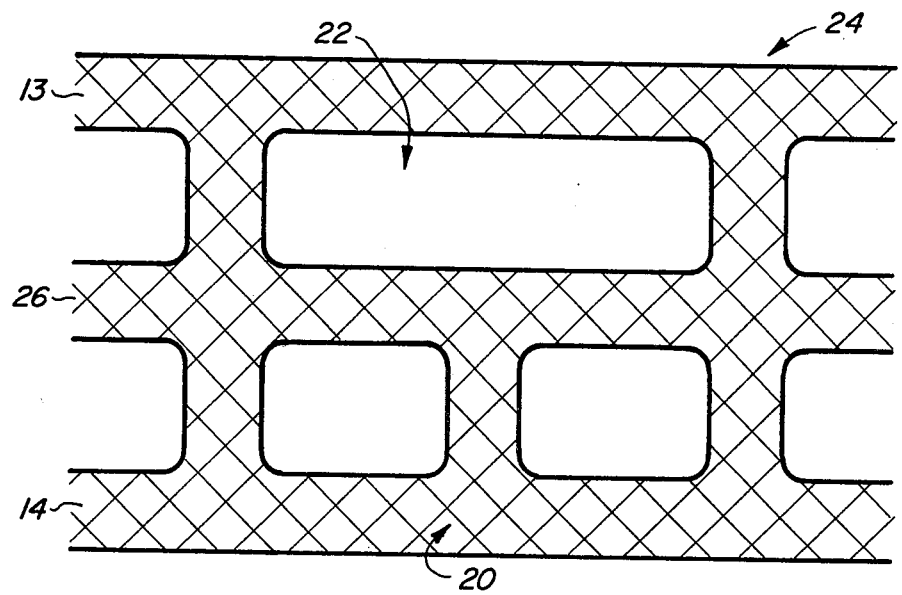
FIGS. 2 and 3 show portions of a prior art layout for achieving an IGFET ROM array.
Figure 3:
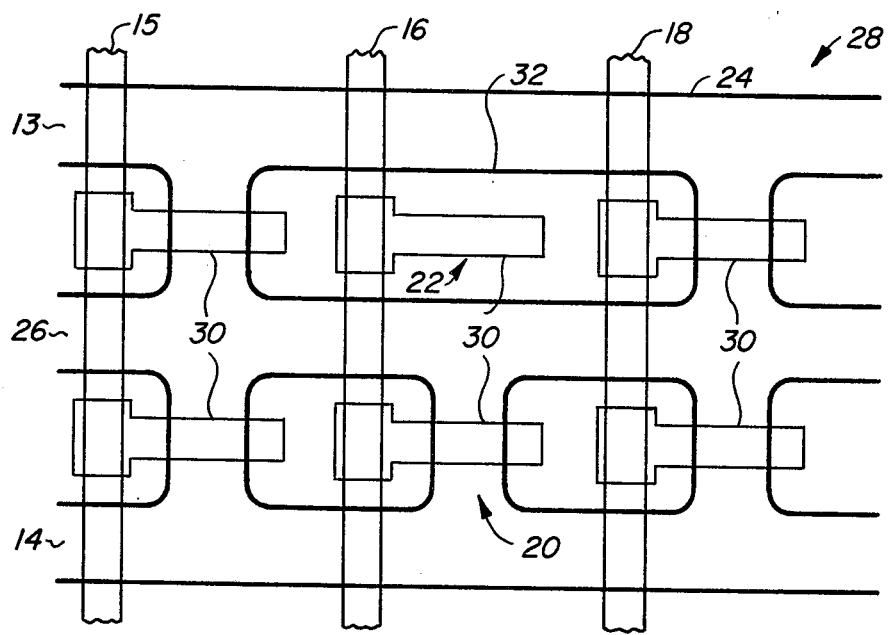

FIGS. 2 and 3 show a portion of a composite prior art mask which could be used to fabricate array 12 of FIG. 1 by means of a conventional silicon gate process. Since the silicon gate process is well known and widely used, only sufficient details will be given here to show how the prior art ROM is programmed. FIG. 2 shows a portion of a photo mask 24 which can be used on a semiconductor wafer to remove an oxide layer from the shaded portions while leaving a thick oxide in the unshaded portions. The shaded portions from which the oxide have been removed will be used later in the process to form bit lines 13, 14 as well as a common ground line 26. The positions at which devices 20, 22 will be fabricated have been indicated. The oxide has been removed from what will be the gate area of device 20 so that a normal thin gate oxide can be formed there. In contrast, the intended gate area of device 22 remains covered with the thick oxide. The programming of the array is thus accomplished by this first photo mask 24.

FIG. 3 shows a composite structure 28 in which the original mask 24 has had portions of two additional masking layers superimposed upon it. In continuing the silicon gate process, a thin gate oxide layer is formed in those areas from which the thick oxide has been removed. A layer of polycrystalline silicon is then formed over the surface of the wafer and patterned using a mask to form polycrystalline silicon gate electrodes 30. Either simultaneously with the patterning of the polycrystalline silicon or in a subsequent step, the thin gate oxide is removed from those areas which are not now protected by the patterned polycrystalline silicon. In so doing, the areas which were rendered oxide free by original mask 24 are again stripped of oxide except for those selected regions under gate electrodes 30. The exposed silicon areas and the polycrystalline silicon are then diffused to form the device source and drain regions, diffused bit lines 13, 14, diffused ground line 26 and to render the gate electrodes conductive. With reference to device 20, bit line 14 and ground line 26 now form diffused drain and source regions, respectively, separated by an undiffused channel region underlying gate electrode 30; the device is thus programmed to the "on" state. In contrast, device 22, programmed to the "off" state, has bit line 13 and ground line 26 forming drain and source regions, respectively, but separated by a thick oxide region 32 which is partially covered by gate electrode 30. Finally, in the latter stages of the processing sequence, an additional mask is used to pattern metallic word lines 15, 16, 18 which make electrical contact to respective gate electrodes 30 over which they pass. The minimum size of the prior art array is sensitive to the device width and length, alignment tolerance, and minimum line to line spacing.

FIGS. 4–10 show in cross-section a series of process steps by which a high density, high performance IGFET ROM array can be fabricated in accordance with the instant invention. The process provides programmed as well as non-programmed devices (that is, devices of each logic state) as well as conventional devices which can be used in circuits peripheral to the array itself. In the preferred embodiment a process is described for forming N channel silicon gate devices on a silicon substrate. The invention is equally applicable to P channel devices formed of any semiconductor material. In the following, various regions will be described as "diffused" or "implanted". The two terms are intended to be used interchangeably to identify those regions doped by either a thermal diffusion process or by ion implantation. The two doping processes are interchangeable.

Figure 4:
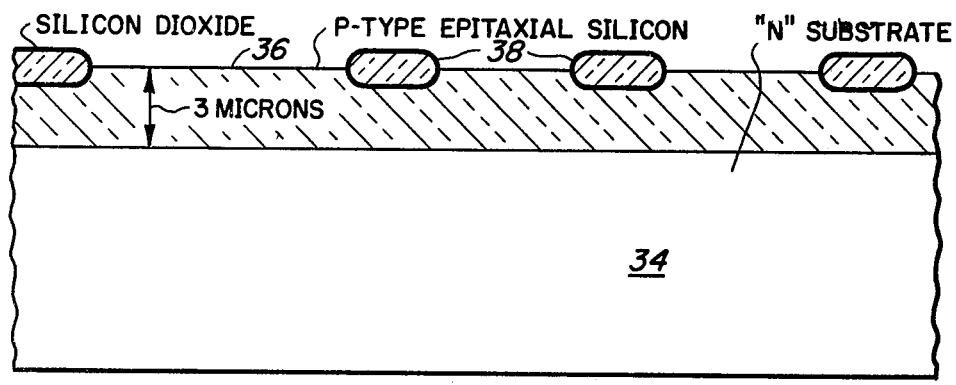
FIGS. 4-10 show in cross-section a series of steps by which an IGFET ROM array can be fabricated in accordance with the invention.

FIG. 4 shows a starting silicon substrate 34 which has been heavily doped N type to a resistivity of, for example, a few tenths ohm centimeter or less. Overlying substrate 34 is a P type epitaxial layer 36 which is about 3 micrometers in thickness and is doped to a resistivity of a few ohm centimeters. The surface of epitaxial layer 36 is divided into a number of active areas by thick oxide isolation regions 38. The oxide isolation regions 38 prevent unwanted parasitic transistor action between active areas and are formed by well known localized oxidation techniques.

Figure 5:
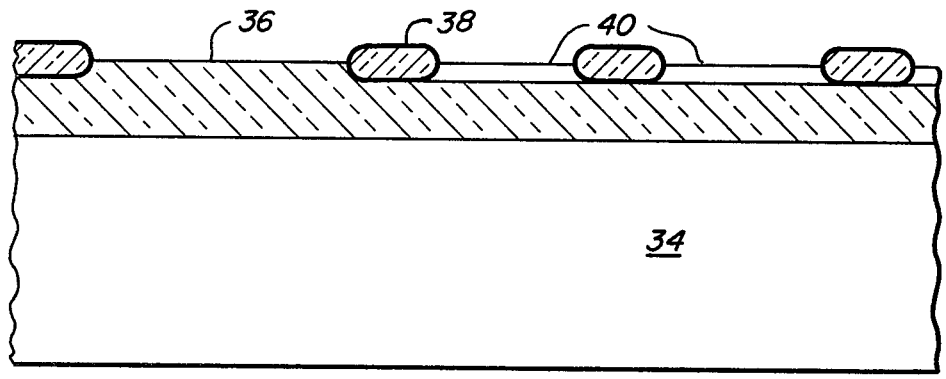

In FIG. 5 localized N type regions 40 are ion implanted into the surface of epitaxial layer 36. The doping of the localized N region 40 is accomplished, for example, by ion implanting phosphorus or arsenic through apertures in a layer of photoresist. This masking operation requires no critical alignment tolerances since the ultimate masking of the implanted ions is performed by isolation oxide 38. The apertures in the photoresist layer can thus be oversized with the only requirement being that the edge of the aperture be located somewhere on isolation oxide 38. The N type region 40 is about one-half micrometer in thickness and heavily doped. These N type regions will ultimately be used to form spaced apart, electrically separate bit lines of the ROM array.

Figure 6:
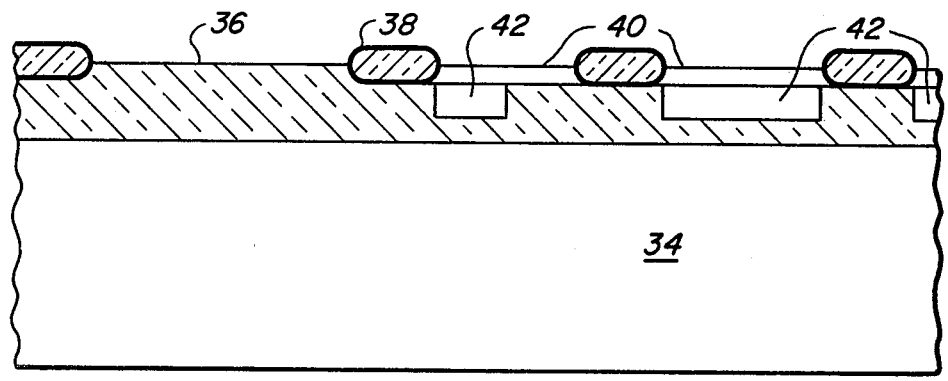

FIG. 6 shows means according to the invention by which the ROM array can be programmed. Selected portions 42 of N type region 40 are diffused or implanted with boron, a P type dopant, to a maximum doping density of approximately $10^{17}$ cm$^{-3}$ at a length of about 0.5 micrometers below the surface. Doped region 42 extends through N region 40 to a depth of about 0.6 to 0.7 micrometers. The implant serves to locally increase the P type doping in epitaxial layer 36 but is light enough so that the surface of region 40 remains N type. As will be seen in the following, the doping serves to raise the threshold voltage of selected ones of the devices of the ROM array.

Figure 7:
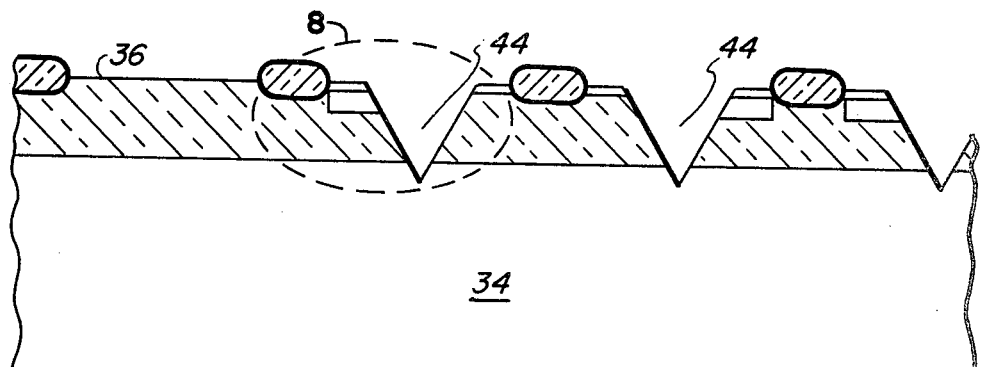

As shown in FIG. 7, a series of V-shaped grooves 44 is next formed in the surface of the wafer. The groove can be formed, for example, by etching the silicon in a potassium hydroxide-alcohol-water mixture which is an anisotropic etchant for silicon. The shape of the groove results from the action of the anisotropic etchant on a particular orientation of the silicon wafer, in this case, the (100) orientation. Groove 44 extends through epitaxial layer 36 to underlying substrate 34 and divides diffused line 40 into two electrically separate bit lines. Looking along each sidewall of the V-grooves one finds the N doped substrate 34 at the bottom of the groove, then a region of P type epitaxial material 36, and N diffused bit line 40 at the top of the groove. These three regions will ultimately form the source, channel, and drain, respectively, of an IGFET. The channel region will be characterized by either the P type doping of the epitaxial layer or, for selected devices, that doping enhanced by the additional doping of the boron programming implant. This is shown more clearly in FIG. 8 which shows a portion of the total structure depicted in FIG. 7.

Figure 9:
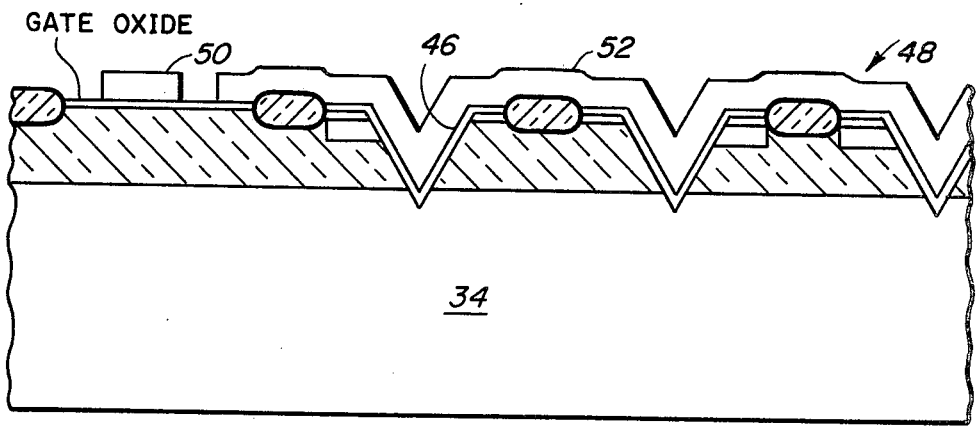

In FIG. 9 a layer of gate insulator is formed covering the exposed silicon surface. The layer might be, for example, a thermally grown layer of silicon dioxide about 60 to 90 nanometers in thickness, or other grown or deposited layers of oxides, nitrides, or the like. The gate insulator covers the sidewalls of the V-groove, the surfaces of the diffused areas, as well as the heretofore unused portion 48 which can be employed for the fabrication of conventional IGFET devices for use in circuitry peripheral to the array. A layer of polycrystalline silicon 50, 52 is then deposited over the gate insulator. Polycrystalline silicon 50, 52 is patterned to form gate electrodes and interconnects. In the ROM array polysilicon electrodes 52 will most likely take the form of parallel, spaced apart word lines oriented orthogonal to the diffused electrically separate bit lines. At each intersection at which word line 52 crosses a diffused electrically separate bit line an IGFET device is formed which functions as one bit of the ROM array. One device is thus formed on each side of the V-groove. The transistors so formed will have either a high threshold voltage or a normal threshold voltage depending upon the presence or absence of the programming dopant in the channel region. The two types of transistors thus represent the bistable logic states.

Figure 10:
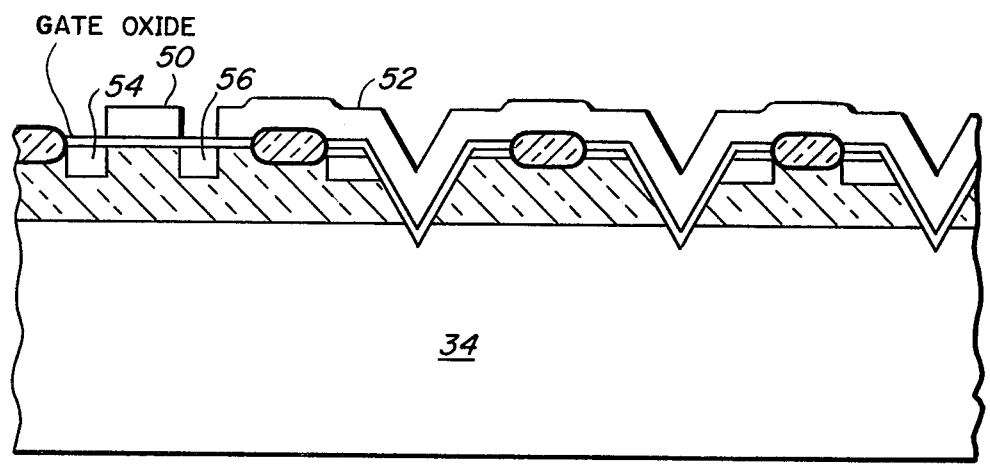

As shown in FIG. 10, the fabrication of the array devices and the conventional peripheral device is continued by removing that portion of gate insulator which is not protected by polycrystalline silicon 50 to expose portions of the silicon surface. An N type diffusion then dopes those exposed portions to form source and drain regions 54, 56 for the conventional IGFET devices and to simultaneously dope and thus render conductive patterned polycrystalline silicon 50, 52. The process is completed in a conventional fashion by applying metal interconnect layers, passivation layer, and the like. The process is thus amenable to the fabrication of programmed and unprogrammed VMOS devices in the ROM array and to the fabrication of conventional IGFET devices for use in the memory periphery.

Figure 8:
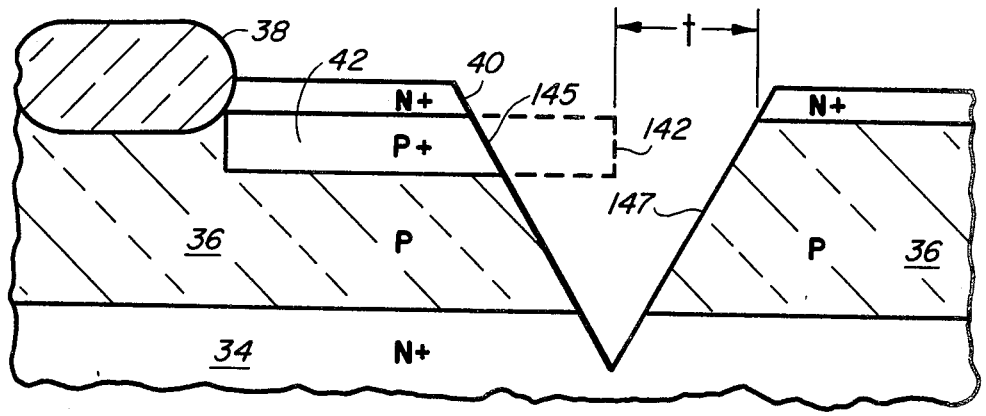
Figure 11:
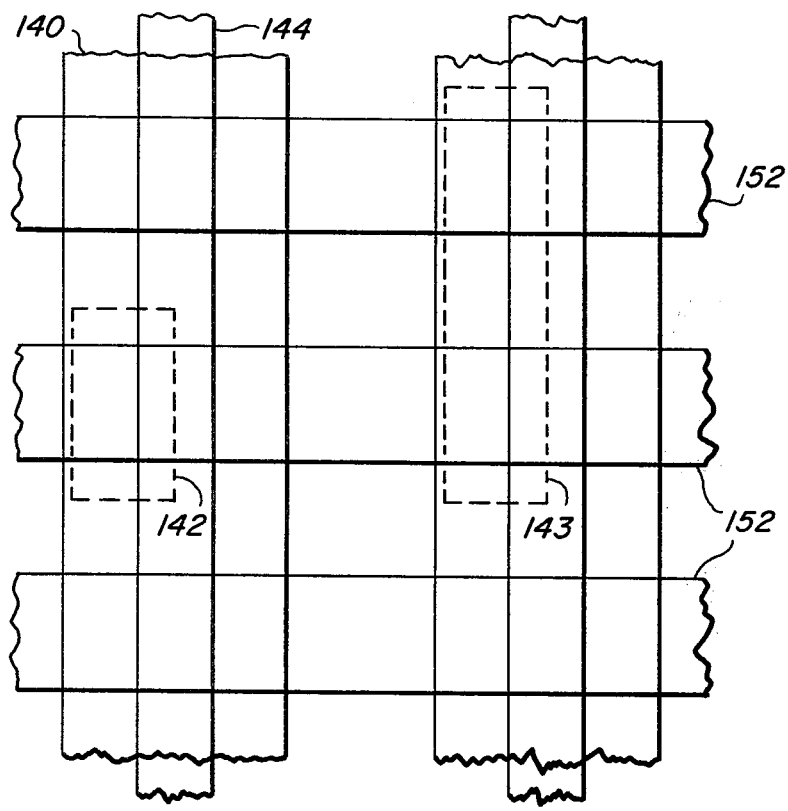
FIG. 11 shows a composite masking arrangement for implementing the process as shown in FIGS. 4-10.

FIG. 11 shows a top view of the surface topology of a portion of the ROM array including that portion of the array shown in cross-section in FIG. 10. A diffused bit line is defined by the line 140 and can be formed by a noncritical photomasking step. The photo mask 140 must merely overlap the isolation oxide 38 with the edge of the already formed oxide 38 providing the diffusion alignment. The programming diffusion 142, 143 is masked by a photo mask shown by the dotted line which also aligns with the isolation oxide 38. The programming mask can provide for the programming of a single device 142 or the programming of multiple adjacent devices 143. Mask 144 for etching the V-groove is aligned to the programming mask 142, 143. Mask 144 extends beyond the ends of diffused bit line 140 to divide the diffused line into two electrically separate lines. Referring back to FIG. 8, the relationship between the alignment of the various masks can be seen more clearly. In FIG. 8 the programming mask 142 is aligned to the diffused bit line region and is allowed to overlap the isolation oxide 38. The V-groove mask 144 must then be aligned to the programming mask to within a tolerance t. If the V-groove mask is shifted to the left by more than the tolerance t, edge 147 of the groove would incorrectly receive some of the programming diffusion. If shifted to the right by more than the tolerance t, edge 145 of the groove would not be adequately doped to program that device. The tolerance t can be the minimum layer to layer registration tolerance permitted by current processing. The V-groove could also be aligned to the bit line diffused region if an acceptable system registration is available to meet the design criteria for cell size. Looking again to FIG. 11, polycrystalline word lines are defined by mask 152. The spacing between adjacent word lines can be the minimum polycrystalline silicon to polycrystalline silicon spacing that processing permits. Parasitic devices between adjacent word lines can be prevented by a parasitic preventing boron field implant performed after the patterning of the polycrystalline silicon by using the polycrystalline silicon itself as an implant mask. The minimization of array size is thus limited in one direction only by the minimum polycrystalline silicon to polycrystalline silicon spacing allowable and in the opposite direction by the minimum allowable layer to layer registration tolerance. The resulting array is thus limited in size by current state of the art processing tolerances; it is not limited by minimum allowable device sizes.

Figure 12:
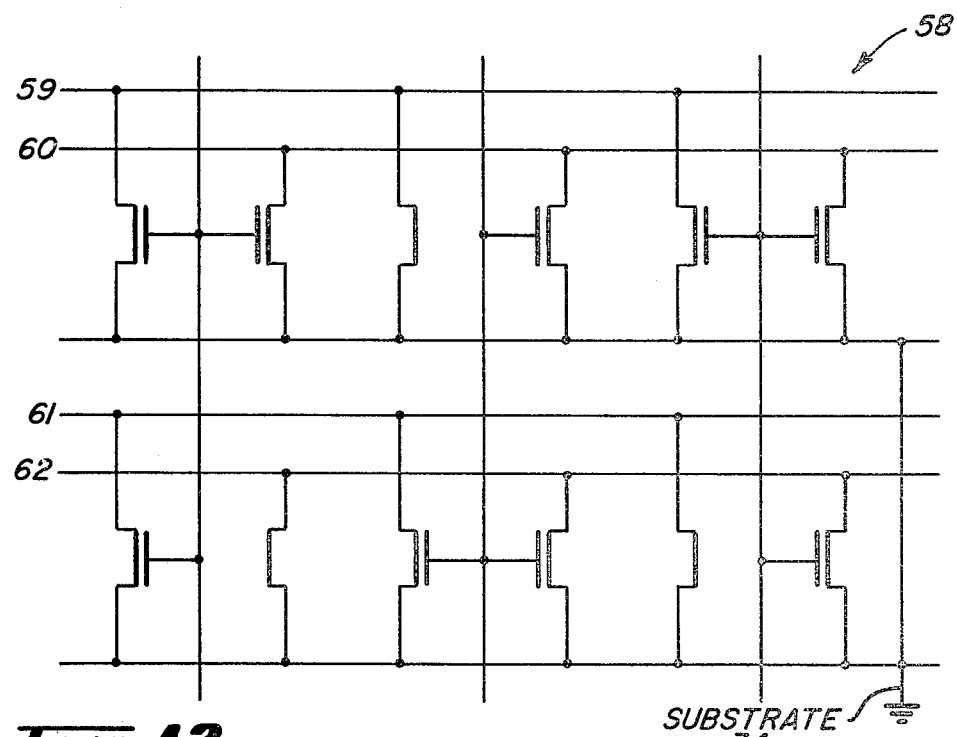
FIG. 12 schematically depicts a portion of a ROM array in accordance with the invention.

Contrast the prior art array topology of FIG. 3 with the topology of the instant invention shown in FIG. 11. The latter does not require the common ground line 26 and thus saves surface area since the common ground for the array is provided by the N type substrate wafer. Further, since a device is fabricated on each side of the V-groove the density of diffused bit lines is effectively doubled. This is schematically depicted by the array 58 shown in FIG. 12. There the electrically separate bit lines 59, 60 are on opposite sides of one V-groove and the electrically separate bit lines 61, 62 are on opposite sides of a second V-groove. The ground connections for each device, of course, are common with the substrate. Because the VMOS devices are fabricated with a common terminal, the peripheral devices must be conventional IGFETs to permit the required circuit flexibility.

Thus it is apparent that there has been provided, in accordance with the invention, a VMOS ROM array and method for programming that fully satisfies the objects and advantages set forth above. While the invention has been described in conjunction with specific embodiments thereof, it is evident that many alternatives, modifications, and variations will be apparent to those skilled in the art in light of the foregoing description. It has been noted, for example, that ion implantation and diffusion can be used interchangeably for doping selected regions, that devices can be either P type or N type, and that semiconductor materials other than silicon can be used. Likewise, the word lines can be of a conductive material other than polycrystalline silicon. Accordingly, it is intended to embrace all such alternatives, modifications, and variations as fall within the spirit and scope of the appended claims.

I claim:

1. An IGFET ROM array comprising: an epitaxial layer of a first conductivity type overlying a semiconductor substrate of a second conductivity type; a plurality of diffused bit lines of said second conductivity type spaced apart in said epitaxial layer; a plurality of spaced apart, conductive word lines overlying said epitaxial layer and said bit lines and insulated therefrom and orthogonally disposed to said bit lines, said word lines and said bit lines crossing at a plurality of locations; a memory bit located at each of said locations, each memory bit including a VMOS transistor having source, drain and gate electrodes and wherein said substrate forms said source electrode of said transistor, one of said bit lines forms said drain electrode of said transistor and one of said word lines forms said gate electrodes overlying a channel region formed along an edge of a V-shaped groove extending through said epitaxial layer and into said substrate, said channel region connecting said source electrode and said drain electrode; selected ones of said memory bits being preprogrammed to an off state by a doped region of said first conductivity type located in said channel region.

2. A semiconductor memory comprising an array of storage sites, said storage sites formed by a structure comprising a semiconductor substrate of a first conductivity type; an epitaxial layer of a second conductivity type overlying said substrate and having a surface; a plurality of spaced apart regions of said first conductivity type diffused into said surface of said epitaxial layer; localized regions of said second conductivity type diffused through selected portions of said spaced apart regions and into said epitaxial layer; grooves formed in said surface and extending through said epitaxial layer and into said substrate, said grooves dividing each of said spaced apart regions to form two electrically separate bit lines; an insulator layer overlying said grooves; and conductive word lines overlying and crossing said bit lines and insulated therefrom by said insulator layer, a storage site coinciding with the intersection of said word line and said bit line, selected ones of said storage sites programmed to an off state by said localized regions of said second conductivity type.

* * * * *